(12) United States Patent
Kikuchi

(10) Patent No.: US 8,415,602 B2
(45) Date of Patent: Apr. 9, 2013

(54) SOLID-STATE IMAGING DEVICE AND ELECTRONIC APPARATUS HAVING AN ELEMENT ISOLATOR IN A SEMICONDUCTOR SUBSTRATE

(75) Inventor: Koji Kikuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 406 days.

(21) Appl. No.: 12/623,608

(22) Filed: Nov. 23, 2009

(65) Prior Publication Data

US 2010/0140453 A1    Jun. 10, 2010

(30) Foreign Application Priority Data

Nov. 25, 2008  (JP) ................................. 2008-298952

(51) Int. Cl.
*H01L 27/00*  (2006.01)

(52) U.S. Cl.
USPC ....................... 250/208.1; 250/239

(58) Field of Classification Search ............... 250/208.1, 250/216, 226, 239, 237 R; 257/290–294, 257/431–443; 348/272–283, 294–308
See application file for complete search history.

(56) References Cited

U.S. PATENT DOCUMENTS

| 7,623,166 B2 * | 11/2009 | Inaba et al. | 348/273 |
| 7,655,998 B2 * | 2/2010 | Oda | 257/432 |
| 8,106,343 B2 * | 1/2012 | Arishima et al. | 250/208.1 |

FOREIGN PATENT DOCUMENTS

| JP | 2004-172278 | 6/2004 |
| JP | 2006-173634 | 6/2006 |
| JP | 2007-005629 | 1/2007 |
| JP | 2008-010879 | 1/2008 |
| JP | 2008-078258 | 4/2008 |
| JP | 2008-270679 | 11/2008 |

OTHER PUBLICATIONS

Japanese Office Action issued on Nov. 9, 2010 in connection with counterpart JP Application No. 2008-298952.
Japanese Office Action issued on Nov. 22, 2011 in connection with counterpart JP Application No. JP-2008-298952.

* cited by examiner

*Primary Examiner* — Que T Le

(74) *Attorney, Agent, or Firm* — SNR Denton US LLP

(57) ABSTRACT

Disclosed herein is a solid-state imaging device including: a pixel part configured to include a plurality of light receiving regions corresponding to different wavelengths; and an element isolator configured to separate the plurality of light receiving regions from each other in such a way that each of the light receiving regions in the pixel part has a size suited to an energy profile of light irradiation with a wavelength handled by the light receiving region.

13 Claims, 11 Drawing Sheets
(1 of 11 Drawing Sheet(s) Filed in Color)

SOLID-STATE IMAGING DEVICE AND ELECTRONIC APPARATUS HAVING AN ELEMENT ISOLATOR IN A SEMICONDUCTOR SUBSTRATE

BACKGROUND OF THE INVENTION

1. Field of the Invention

The present invention relates to a solid-state imaging device and an electronic apparatus. Specifically, the invention relates to a solid-state imaging device and an electronic apparatus in each of which a pixel part is formed of plural light receiving regions and each of the light receiving regions has a size dependent on the wavelength handled by the light receiving region.

2. Description of the Related Art

For semiconductor image sensors typified by complementary metal oxide semiconductor (CMOS) image sensors, pixel increasing, achieved by reducing the pixel size and increasing the number of pixels in the same image area, is always required. However, along with the pixel increasing, the amount of signal becomes smaller and it becomes more difficult to ensure the same S/N ratio (refer to Japanese Patent Laid-Open No. 2006-173634). Furthermore, the difference in the sensitivity among red (R), green (G), and blue (B) pixels also becomes larger, which causes the corruption of the color balance.

SUMMARY OF THE INVENTION

FIG. 11A is a schematic sectional view for explaining one example of the structure of a CMOS image sensor. If the pixel size is decreased in such a CMOS image sensor, the wavelength-by-wavelength difference in the image forming capability becomes a problem. For example, even when the focal point matches the photodiode, the energy profile on the silicon substrate surface differs among Blue, Green, and Red pixels as shown in FIG. 11B. This profile difference causes problems such as sensitivity deterioration and color shading.

There is a need for the present invention to change the size of a photodiode depending on the wavelength band handled by the photodiode to thereby adjust the sensitivity balance among colors.

According to an embodiment of the present invention, there is provided a solid-state imaging device including a pixel part configured to include a plurality of light receiving regions corresponding to different wavelengths, and an element isolator configured to separate the plurality of light receiving regions from each other in such a way that each of the light receiving regions in the pixel part has a size suited to the energy profile of light irradiation with a wavelength handled by the light receiving region.

According to another embodiment of the present invention, there is provided an electronic apparatus including a solid-state imaging device configured to have a pixel part in which a plurality of light receiving regions corresponding to different wavelengths are disposed and an element isolator that separates the plurality of light receiving regions from each other in such a way that each of the light receiving regions in the pixel part has a size suited to the energy profile of light irradiation with a wavelength handled by the light receiving region, and an image processor configured to process, as an image, a signal arising from light reception by the light receiving regions in the solid-state imaging device.

In the embodiments of the present invention, each of the plurality of light receiving regions has a size suited to the energy profile of light irradiation with the wavelength handled by the light receiving region, and therefore the balance of the light reception sensitivities of the plurality of light receiving regions can be adjusted.

According to the embodiments of the present invention, the size of the light receiving region in the pixel is set depending on the energy profile of the handled wavelength, and thus the sensitivity balance among colors can be adjusted.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION OF THE PREFERRED EMBODIMENTS

Best modes (embodiments, hereinafter) for carrying out the present invention will be described below. The description will be made in the following order.
1. First Embodiment (Example of Solid-State Imaging Device of Back-Side Irradiation Type)
2. Second Embodiment (Example of Solid-State Imaging Device of Front-Side Irradiation Type)
3. Electronic Apparatus (Example of Imaging Device)
1. First Embodiment
[Structure of Solid-State Imaging Device]

Figure 1:
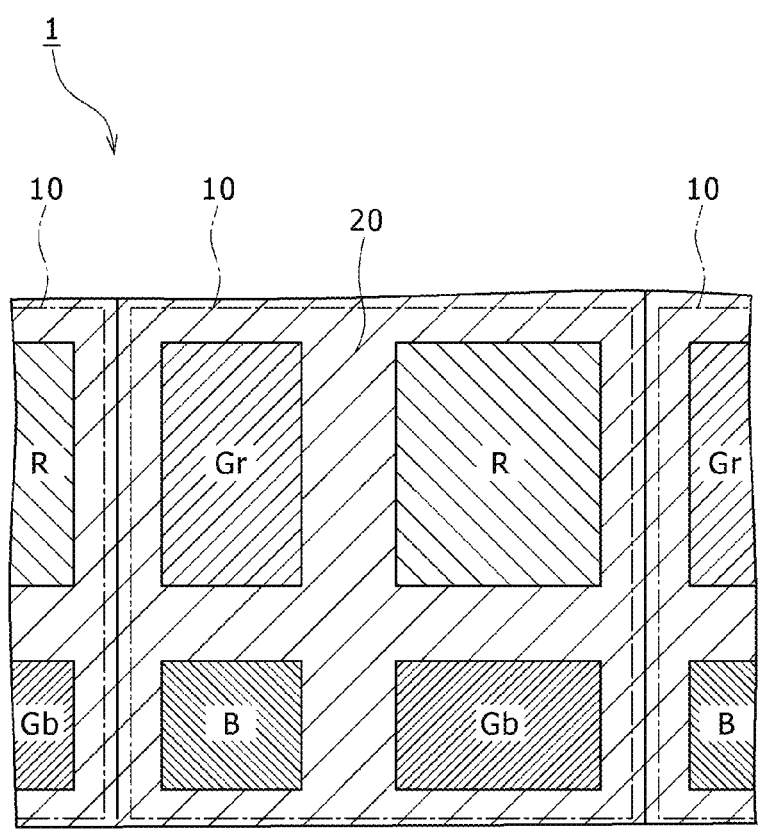
FIG. 1 is a schematic plan view for explaining a solid-state imaging device according to a first embodiment of the present invention.

FIG. 1 is a schematic plan view for explaining a solid-state imaging device according to a first embodiment of the present invention. FIG. 1 focuses on a pixel part 10 in which plural light receiving regions corresponding to different wavelengths are disposed. The pixel parts 10 are arranged in a matrix along the vertical and horizontal directions. In FIG. 1, one of the pixel parts 10 is shown at the center and the pixel parts 10 on both sides of this center pixel part 10 are so shown that partial portions thereof are cut.

In one pixel part 10, 2×2 light receiving regions arranged along the vertical and horizontal directions are disposed. The plural light receiving regions are so configured that the corresponding wavelength differs by a color filter (not shown) formed on the light incidence side. In the present embodiment, the size of the light receiving region is 1.1 μm square.

In the example shown in FIG. 1, the following four light receiving regions are provided as 2×2 light receiving regions: a light receiving region B corresponding to blue, a light receiving region R corresponding to red, a light receiving region Gb corresponding to first green (green disposed on the same row as that of blue), and a light receiving region Gr corresponding to second green (green disposed on the same row as that of red). The first green and the second green are the same in the handled wavelength.

Of these light receiving regions, the light receiving region B corresponding to blue and the light receiving region R corresponding to red are disposed on one diagonal line, whereas the light receiving region Gb corresponding to the first green and the light receiving region Gr corresponding to the second green are disposed on the other diagonal line. Specifically, the array of the color filter for forming the light receiving regions B, R, Gb, and Gr of the respective colors is the Bayer array.

An element isolator 20 is provided to separate the plural light receiving regions B, R, Gb, and Gr from each other in the pixel part 10. The light receiving regions B, R, Gb, and Gr are provided in a P-type well region formed in a semiconductor substrate such as a silicon substrate and are photodiodes formed by implantation of N-type and P-type impurity ions. In order to electrically isolate these light receiving regions B, R, Gb, and Gr from each other, P-type impurity ions are implanted into the element isolator 20. Due to this, a PN junction is formed between the light receiving regions, so that the electrical isolation is achieved.

In the present embodiment, the light receiving regions B, R, Gb, and Gr formed by such an element isolator 20 are so configured as to each have a size suited to the energy profile of light irradiation with the wavelength handled by the light receiving region.

Figure 2:
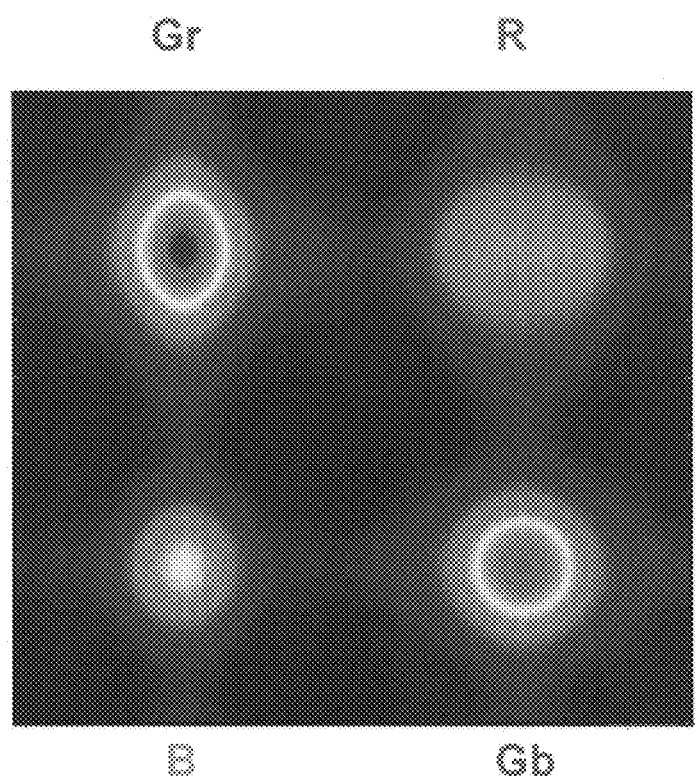
FIG. 2 is a diagram showing the energy profile on the silicon substrate surface, corresponding to the respective colors (wavelengths) of B, R, Gb, and Gr.

FIG. 2 is a diagram showing the energy profile on the silicon substrate surface, corresponding to the respective colors (wavelengths) of B, R, Gb, and Gr. This diagram shows the intensity and spread of the irradiation energy on the silicon substrate surface for the respective colors (wavelengths) of B, R, Gb, and Gr. According to this diagram, the light of blue (B) has the highest irradiation energy and the narrowest spread. On the other hand, the light of red (R) has the lowest irradiation energy and the widest spread.

In the present embodiment, the size of the light receiving region is set depending on the above-described energy profile, which differs from color to color. In particular, the size is so set that the light receiving region corresponding to light with a longer wavelength has a larger size.

Specifically, the element isolator 20 is so provided that the light receiving region R corresponding to red is larger than the light receiving region Gb, which is adjacent to the light receiving region R and corresponds to the first green, in the above-described color filter arrangement.

Furthermore, the element isolator 20 is so provided that the light receiving region R corresponding to red is larger than the light receiving region Gr, which is adjacent to the light receiving region R and corresponds to the second green, in the above-described color filter arrangement.

That is, in a solid-state imaging device of the related art, all of the light receiving regions B, R, Gb, and Gr corresponding to the respective colors have the same size obtained by equally dividing the pixel part 10 into 2×2 regions arranged along the vertical and horizontal directions. On the other hand, in the present embodiment, the light receiving region R corresponding to red is so provided with the largest size as to spread toward both of the light receiving region Gb corresponding to the first green and the light receiving region Gr corresponding to the second green. The light receiving region R corresponding to red may be so provided as to spread toward only either one of the light receiving region Gb corresponding to the first green and the light receiving region Gr corresponding to the second green according to need.

The reason for such size setting is that the light of red (R) has the lowest irradiation energy and the widest spread as shown in FIG. 2 and the light receiving region R is so designed as to have the size corresponding to this spread.

Furthermore, in the present embodiment, the element isolator 20 is so provided that the light receiving region B corresponding to blue is smaller than the light receiving region Gb, which is adjacent to the light receiving region B and corresponds to the first green.

The reason for such size setting is that the light of blue (B) has the highest irradiation energy and the narrowest spread as shown in FIG. 2 and the light receiving region B is so designed as to have the size corresponding to this spread.

It is preferable that the aperture shapes of the light receiving region R corresponding to red and the light receiving region B corresponding to blue be each a square suited to the irradiation energy profile.

On the other hand, the aperture shapes of the light receiving region Gb corresponding to the first green and the light receiving region Gr corresponding to the second green are rectangles. The purpose thereof is to efficiently use the remaining rectangular areas obtained when the pixel part 10 is a square and squares are employed as the aperture shapes of the light receiving region R corresponding to red and the light receiving region B corresponding to blue as described above.

Moreover, the light receiving region Gb corresponding to the first green and the light receiving region Gr corresponding to the second green have such aperture shapes that the longer side directions thereof are orthogonal to each other. This allows efficient capturing of light beams with polarization directions orthogonal to each other as green light beams.

As above, each of the light receiving regions B, R, Gb, and Gr of the respective colors formed by the element isolator 20 has a size suited to the energy profile of light irradiation with the wavelength handled by the light receiving region. This can adjust the balance of the amounts of light beams received by the light receiving regions B, R, Gb, and Gr and can suppress the shift of the sensitivity balance among the colors.

[Sectional Structure]

Figure 3:
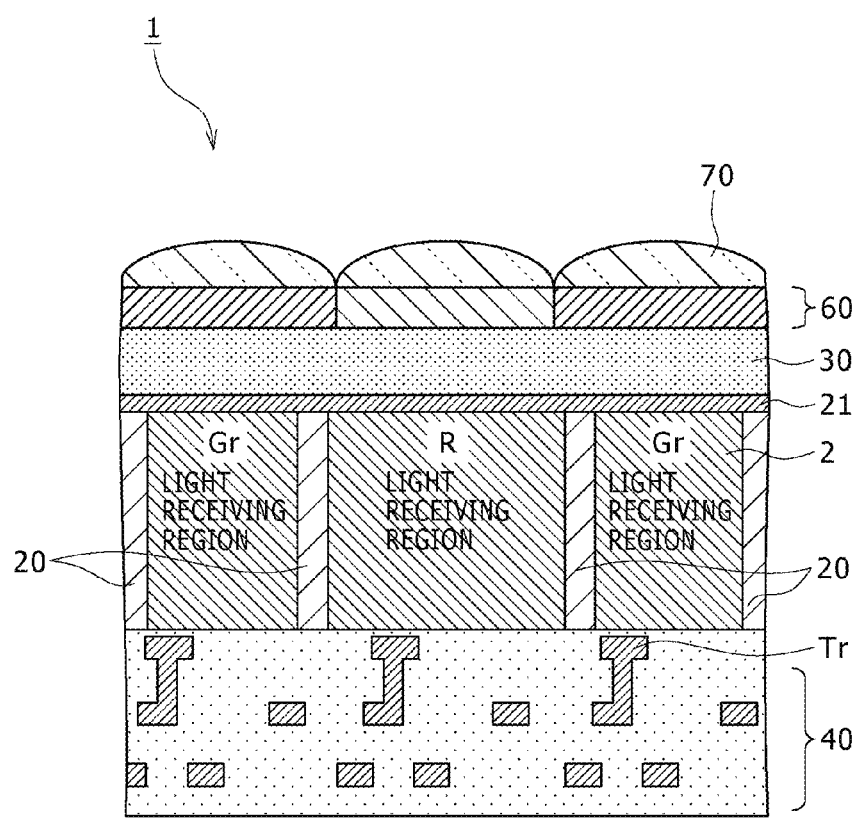
FIG. 3 is a schematic sectional view along the row of light receiving regions R and Gr.
Figure 4:
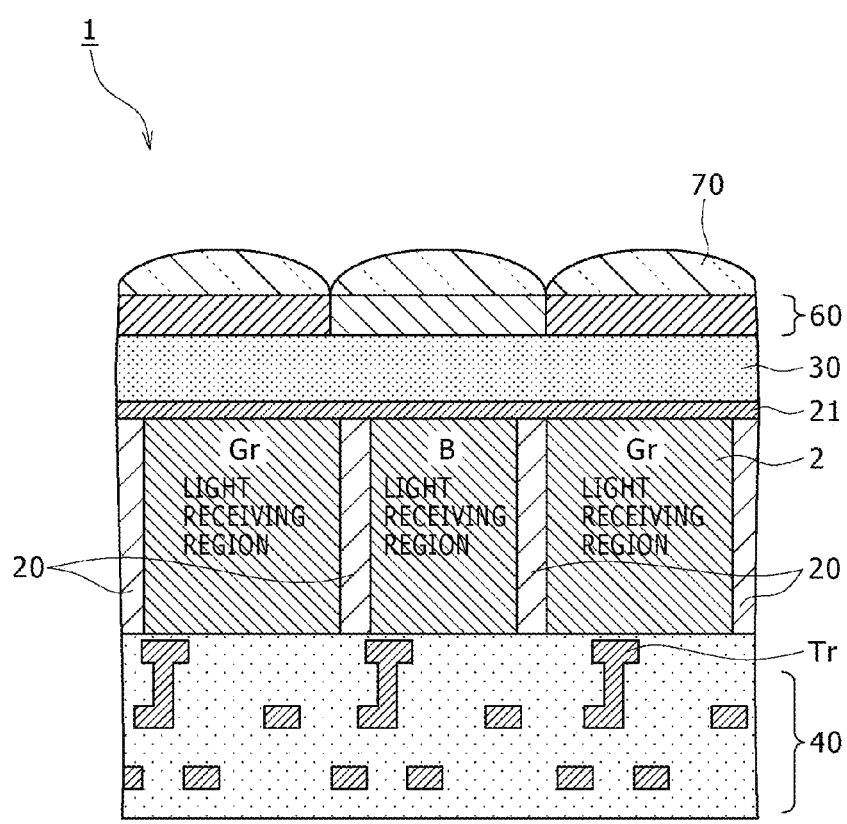
FIG. 4 is a schematic sectional view along the row of light receiving regions B and Gr.

FIG. 3 is a schematic sectional view along the row of the light receiving regions R and Gr shown in FIG. 1. FIG. 4 is a schematic sectional view along the row of the light receiving regions B and Gr shown in FIG. 1.

In a solid-state imaging device 1 of the present embodiment, a color filter 60 is provided over one surface of a silicon substrate 2 in which the light receiving regions R and Gr in the pixel parts are provided, and an interconnect layer 40 for a signal obtained through photoelectric conversion by the light receiving regions R and Gr is provided over the other surface of the silicon substrate 2. The solid-state imaging device 1 has a so-called back-side irradiation CMOS sensor configuration.

Specifically, in this solid-state imaging device 1, the light receiving regions R and Gr of the respective colors formed in the silicon substrate 2 are isolated from each other by the element isolator 20, and the color filter 60 is formed over the light receiving regions R and Gr with the intermediary of an antireflection film 21 and an interlayer insulating film 30. The color filter 60 has the Bayer array in matching with the arrangement of the light receiving regions corresponding to the respective colors. Microlenses 70 are provided on the color filter 60 of the respective colors.

For the manufacturing of the so-called back-side irradiation CMOS sensor, the element isolator 20 for isolating the light receiving regions B, R, Gb, and Gr corresponding to the respective colors from each other is formed by implantation of P-type ions into the surface of the silicon substrate 2 (on the lower side, in FIG. 3). Furthermore, the light receiving regions B, R, Gb, and Gr corresponding to the respective colors are so formed as to be surrounded by the element isolator 20 by implantation of N-type and P-type impurities. Over the light receiving regions B, R, Gb, and Gr, transistors Tr for pixel driving and so on and the interconnect layer 40 are formed.

The kinds of transistor Tr include a readout transistor for reading out the charge captured by the light receiving regions B, R, Gb, and Gr, an amplification transistor for amplifying the output of the photodiode, a selection transistor for selecting the photodiode, and a reset transistor for discharging the charge.

In this state, a support substrate is attached to the interconnect layer side of the silicon substrate 2, and the back side of the silicon substrate 2 (on the upper side, in FIG. 3) is polished by chemical mechanical polishing (CMP) in such a way that the silicon substrate 2 is supported by the support substrate. This polishing is performed until the light receiving regions are exposed.

Subsequently, the antireflection film 21 (e.g. composed of HfO and having a thickness of 64 nm) and the interlayer insulating film 30 (e.g. composed of $SiO_2$ and having a thickness of 500 nm) are formed over the back surface of the silicon substrate 2 at which the light receiving regions are exposed.

Moreover, over the interlayer insulating film 30, the color filter 60 (e.g. having a thickness of 500 nm) corresponding to the light receiving regions is formed and the microlenses 70 (e.g. having a thickness of 350 nm at the lens center part) are formed corresponding to the color filter 60.

This completes the solid-state imaging device 1 in which light is incident from the back side of the silicon substrate 2 (on the upper side, in FIG. 3) and is condensed by the microlenses 70 and light beams of the respective colors are received by the light receiving regions via the color filter 60. In this structure, the interconnect layer 40 does not exist on the light incidence side of the light receiving regions, and therefore the respective light receiving regions are allowed to have enhanced aperture efficiency.

In the present embodiment, in the manufacturing of the solid-state imaging device 1, the aperture area of the light receiving regions can be set through the change of only the formation position of the element isolator 20. Specifically, regarding the relationship between the light receiving region R and the light receiving region Gr shown in FIG. 3, the position of the element isolator 20 (the implantation position of the P-type impurity ions) is so set that the light receiving region R is wider. This position setting can be carried out through the change of only the mask used in the implantation of the P-type impurity ions.

Similarly, in the section along the row of the light receiving regions B and Gr shown in FIG. 4, regarding the relationship between the light receiving region B and the light receiving region Gr, the position of the element isolator 20 (the implantation position of the P-type impurity ions) is so set that the light receiving region B is narrower. This position setting can be carried out through the change of only the mask used in the implantation of the P-type impurity ions.

That is, it is sufficient that the transistors Tr, the interconnect layer 40, the color filter 60, and the microlenses 70 are each formed with the repetition of the same pitch whereas only the implantation position of the P-type impurity ions for the element isolator 20, which defines the sizes of the light receiving regions B, R, Gb, and Gr, is changed.

[Comparison of Color Crosstalk and Sensitivity]

Figure 5A:
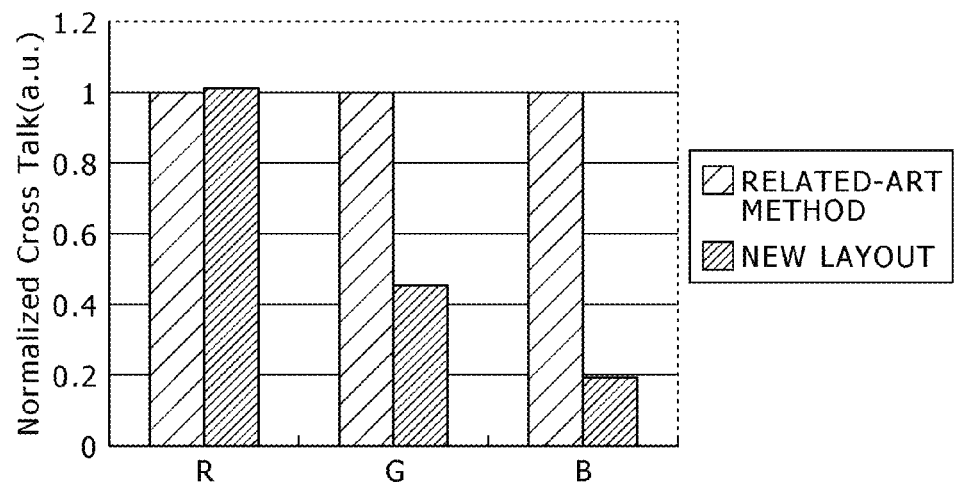
FIGS. 5A and 5B are diagrams for explaining the results of comparison of color crosstalk and the sensitivity.
Figure 5B:
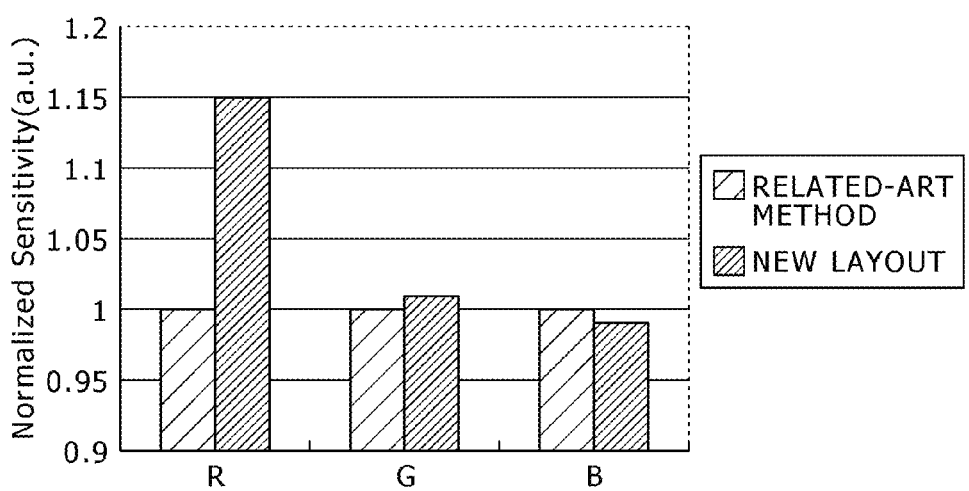

FIGS. 5A and 5B are diagrams for explaining the results of comparison of color crosstalk and the sensitivity: FIG. 5A relates to the color crosstalk and FIG. 5B relates to the sensitivity. In the diagrams, R, G, and B indicate the color crosstalk and the sensitivity about red, green, and blue, respectively. Each diagram shows comparison between the layout of the related art and the layout of the present embodiment. In the layout of the related art, 2×2 light receiving regions of the respective colors arranged along the vertical and horizontal directions arise from equal division (have an equal aperture area). Each diagram employs relative representation in which the values of the RGB respective colors in the layout of the related art are defined as 1.

As for the color crosstalk shown in FIG. 5A, the color crosstalk is almost the same about red (R), whereas the color crosstalk is significantly suppressed about green (G) and blue (B) in the layout of the present embodiment. In the present embodiment, the size of the light receiving region suited to the energy profile of irradiation light is set. Therefore, compared with the layout of the related art, the red light receiving region is wider and the green and blue light receiving regions are narrower.

Therefore, for green and particularly blue, corresponding to the narrowed light receiving regions, the other colors are captured from the periphery less readily and the color crosstalk can be suppressed.

As for the sensitivity shown in FIG. 5B, the sensitivity to green (G) and blue (B) is almost the same, whereas the sensitivity to red (R) is significantly higher in the layout of the present embodiment. This is because of the following reason. Specifically, as for green and blue, the light receiving regions each have the size suited to the energy profile although they are narrower than those in the layout of the related art. Thus, no change is found in the sensitivity. On the other hand, as for red, the light receiving region is wider than that in the layout of the related art. Thus, light in such an area that the light can not be captured in the layout of the related art can also be captured, which enhances the sensitivity.

As above, in contrast to the layout of the related art, in which the sensitivity to red is low and color crosstalk of green and blue occurs, the present embodiment can realize such sensitivity balance that the sensitivity to red is high and color crosstalk of green and blue is suppressed.

2. Second Embodiment

[Structure of Solid-State Imaging Device]

Figure 6:
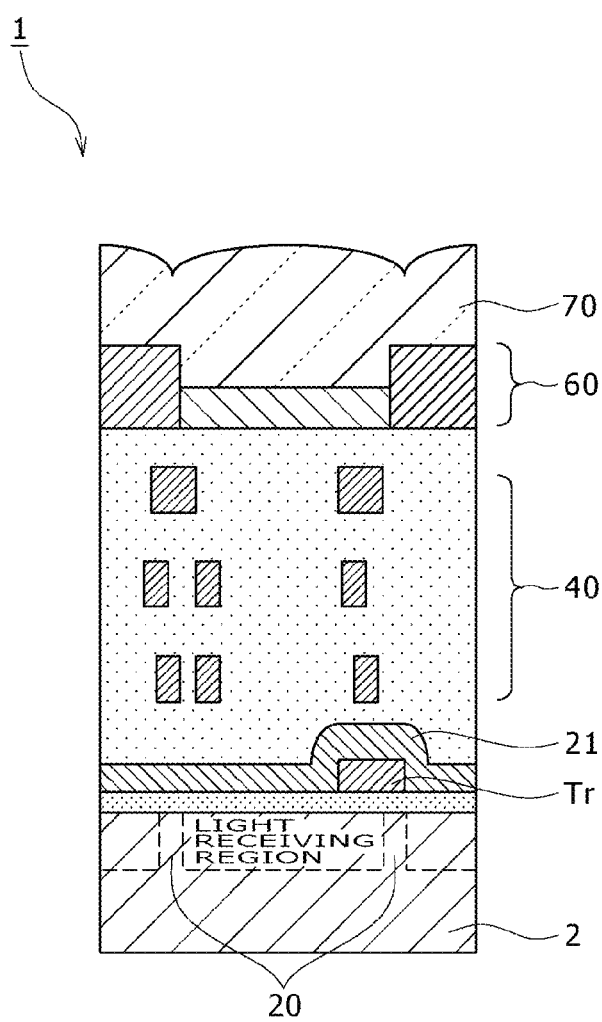
FIG. 6 is a schematic sectional view for explaining one example of the structure of a solid-state imaging device according to a second embodiment of the present invention.

FIG. 6 is a schematic sectional view for explaining one example of the structure of a solid-state imaging device according to a second embodiment of the present invention. Light receiving regions that are photodiodes are formed in a silicon substrate 2, and transistors Tr are formed corresponding to the light receiving regions.

The kinds of transistor Tr include a readout transistor for reading out the charge captured by the light receiving region, an amplification transistor for amplifying the output of the photodiode, a selection transistor for selecting the photodiode, and a reset transistor for discharging the charge.

An antireflection film 21 is formed on the transistors Tr, and plural interconnect layers 40 are formed with the intermediary of an interlayer insulating film. An optical waveguide formed of an organic film may be buried in the interconnect layer 40 according to need.

Above the interconnect layers 40, an RGB color filter 60 is formed for each predetermined area in a predetermined array order. Furthermore, microlenses 70 are formed corresponding to the color filter 60 of the respective colors. In the present embodiment, the size of the aperture of one light receiving region is 2.5 μm square.

This solid-state imaging device 1 has a structure including the interconnect layers 40 and the color filter 60 over one surface of the silicon substrate 2 in which the light receiving regions in the pixel parts are provided. Specifically, this solid-state imaging device 1 has a so-called front-side irradiation CMOS sensor structure in which the microlenses 70, the color filter 60, and the interconnect layers 40 are provided on the light incidence side of the light receiving regions.

In this solid-state imaging device 1, ambient light is condensed by the microlenses 70 and separated into light beams with wavelengths corresponding to predetermined colors via the color filter 60 of the RGB respective colors. The light beams of the RGB respective colors pass through the interconnect layers 40 and reach the light receiving regions provided in the silicon substrate 2. The light beams are subjected to photoelectric conversion in the light receiving regions, so that electric signals dependent on the amounts of light beams of the RGB respective colors can be achieved by driving of the transistors Tr.

For the microlens 70, correction of 0.5 μm for an image height of 100% is applied in order to improve the matching with the lens of an imaging device to which the solid-state imaging device 1 of the present embodiment is applied. The correction amount is proportional to the image height and the correction direction is oriented toward the center of the field angle.

[Layout of Light Receiving Regions]

Figure 7A:
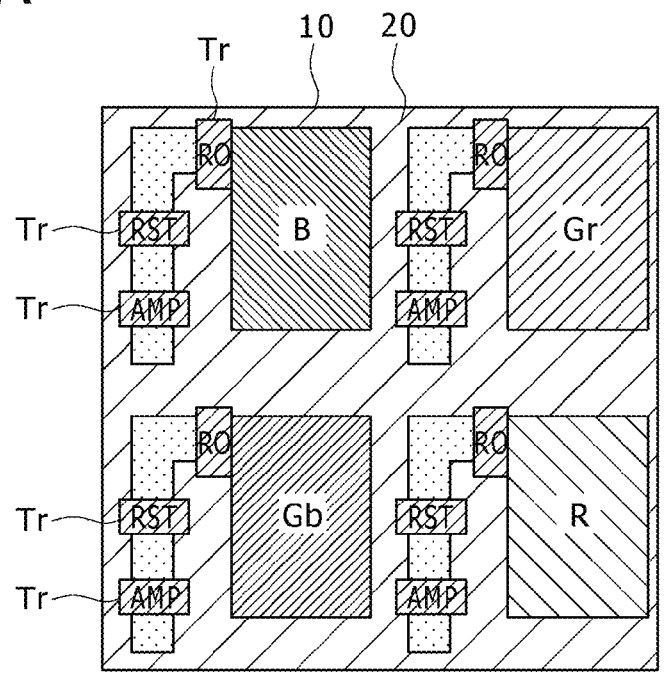
FIGS. 7A and 7B are schematic plan views for explaining the layout of light receiving regions.
Figure 7B:
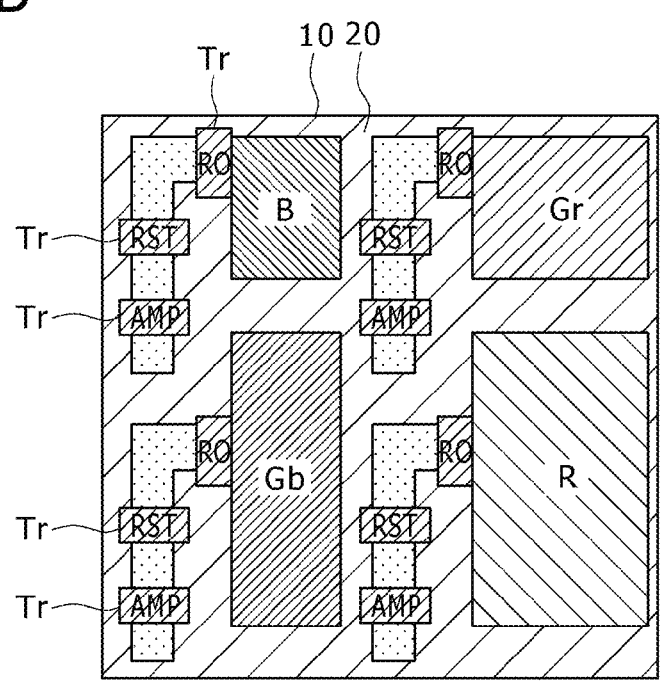

FIGS. 7A and 7B are schematic plan views for explaining the layout of the light receiving regions: FIG. 7A shows the layout of the related art and FIG. 7B shows the layout of the present embodiment. Although only one pixel part 10 is shown in FIGS. 7A and 7B, the plural pixel parts 10 are arranged in a matrix along the vertical and horizontal directions.

As shown in FIG. 7A, in the related-art layout of the light receiving regions, 2×2 light receiving regions arranged along the vertical and horizontal directions are provided in one pixel part 10. Specifically, as the light receiving regions, the light receiving region B corresponding to blue, the light receiving region R corresponding to red, the light receiving region Gb corresponding to the first green, and the light receiving region Gr corresponding to the second green are disposed. The respective light receiving regions B, R, Gb, and Gr are so separated from each other by the element isolator 20 as to have the same size.

The plural transistors Tr are provided between the respective light receiving regions B, R, Gb, and Gr. The kinds of transistor Tr include a readout transistor (RO), a reset transistor (RST), and an amplification transistor (AMP).

On the other hand, in the layout of the light receiving regions in the present embodiment shown in FIG. 7B, the light receiving region R corresponding to red is provided with a large size although the arrangement of the respective light receiving regions B, R, Gb, and Gr and the transistors Tr are the same as that in the layout of the related art. That is, the light receiving region R corresponding to red is so provided as to have a size larger than the size of the light receiving region Gr, which is adjacent to the light receiving region R and corresponds to the second green.

Furthermore, in the present embodiment, the light receiving region B corresponding to blue is so provided as to have a size smaller than the size in the related art. Specifically, the light receiving region B corresponding to blue is so provided as to have a size smaller than the size of the light receiving region Gb, which is adjacent to the light receiving region B and corresponds to the first green.

Specifically, in the layout of the light receiving regions in the present embodiment, the light receiving regions B, R, Gb, and Gr are so configured as to each have the size suited to the energy profile (see FIG. 2) of light irradiation with the wavelength handled by the light receiving region. In particular, the size is so set that the light receiving region corresponding to light with a longer wavelength has a larger size.

Setting the size of each of the light receiving regions B, R, Gb, and Gr to the size suited to the energy profile of light irradiation with the handled wavelength like in the solid-state imaging device 1 of the present embodiment can be carried out based on the formation position of the element isolator 20.

Specifically, as shown in FIG. 6, in the formation of the element isolator 20 for separating the light receiving regions in the silicon substrate 2, the implantation position of P-type impurity ions corresponding to the position of the element isolator 20 is set in matching with the sizes of the light receiving regions B, R, Gb, and Gr. This position setting can be carried out through the change of only the mask used in the implantation of the P-type impurity ions.

[Comparison of Color Crosstalk and Sensitivity]

Figure 8A:
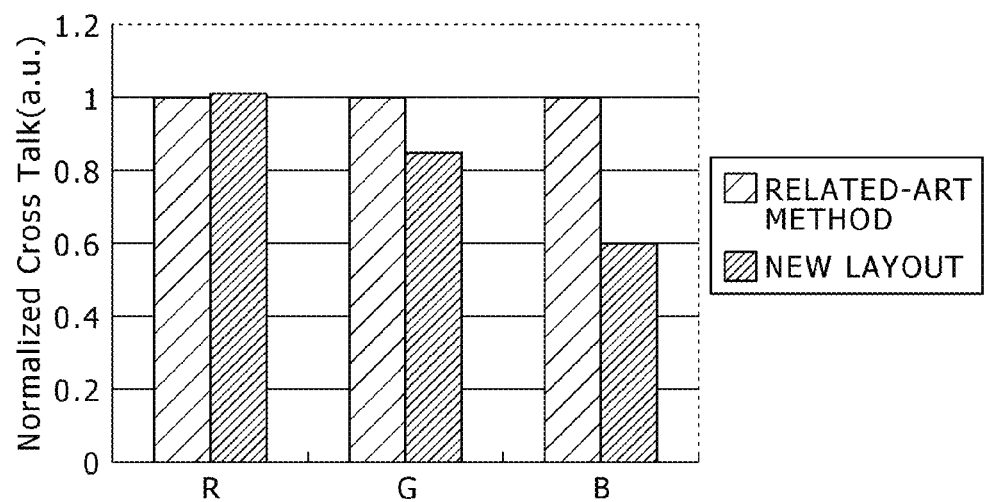
FIGS. 8A and 8B are diagrams for explaining the results of comparison of color crosstalk and the sensitivity.
Figure 8B:
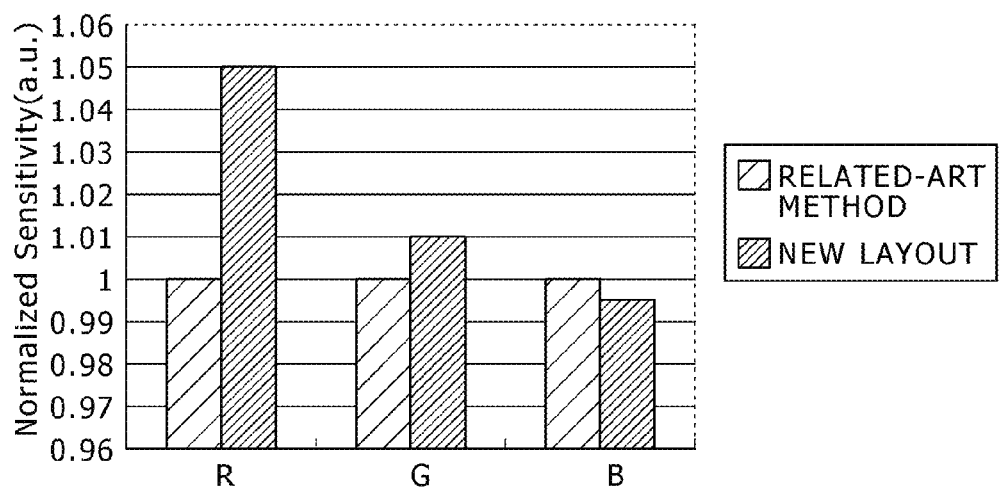

FIGS. 8A and 8B are diagrams for explaining the results of comparison of color crosstalk and the sensitivity: FIG. 8A relates to the color crosstalk and FIG. 8B relates to the sensitivity. In the diagrams, R, G, and B indicate the color crosstalk and the sensitivity about red, green, and blue, respectively. Each diagram shows comparison between the layout of the related art and the layout of the present embodiment. In the layout of the related art, 2×2 light receiving regions of the respective colors arranged along the vertical and horizontal directions arise from equal division (have an equal aperture area). Each diagram employs relative representation in which the values of the RGB respective colors in the layout of the related art are defined as 1.

As for the color crosstalk shown in FIG. 8A, the color crosstalk is almost the same about red (R), whereas the color crosstalk is significantly suppressed about green (G) and blue (B) in the layout of the present embodiment. In the present embodiment, the size of the light receiving region suited to the energy profile of irradiation light is set. Therefore, compared with the layout of the related art, the red light receiving region is wider and the green and blue light receiving regions are narrower.

Therefore, for green and particularly blue, corresponding to the narrowed light receiving regions, the other colors are captured from the periphery less readily and the color crosstalk can be suppressed.

As for the sensitivity shown in FIG. 8B, the sensitivity to green (G) and blue (B) is almost the same, whereas the sensitivity to red (R) is significantly higher in the layout of the present embodiment. This is because of the following reason. Specifically, as for green and blue, the light receiving regions each have the size suited to the energy profile although they are narrower than those in the layout of the related art. Thus, no change is found in the sensitivity. On the other hand, as for red, the light receiving region is wider than that in the layout of the related art. Thus, light in such an area that the light can not be captured in the layout of the related art can also be captured, which enhances the sensitivity.

As above, in contrast to the layout of the related art, in which the sensitivity to red is low and color crosstalk of green and blue occurs, the present embodiment can realize such sensitivity balance that the sensitivity to red is high and color crosstalk of green and blue is suppressed.

Figure 9A:
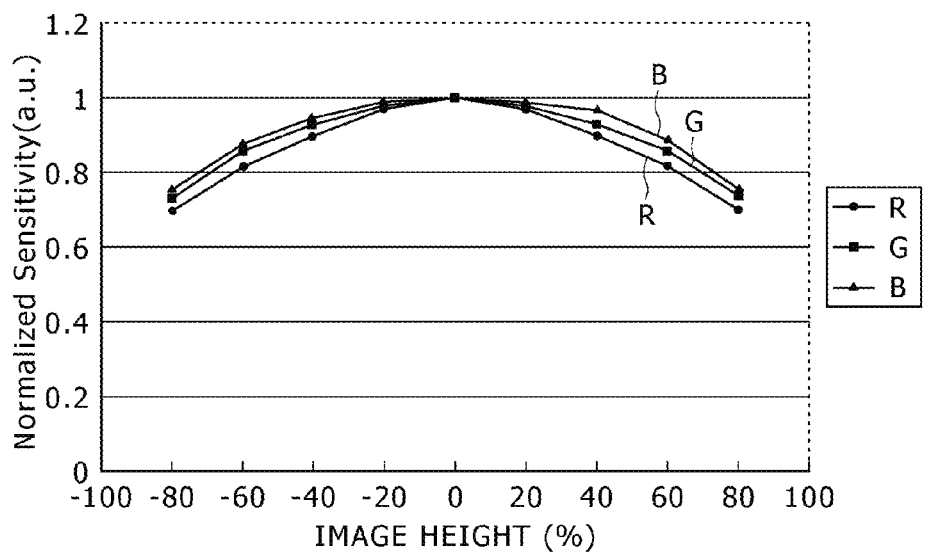
FIGS. 9A and 9B are diagrams for explaining the effect of suppression of color shading.
Figure 9B:
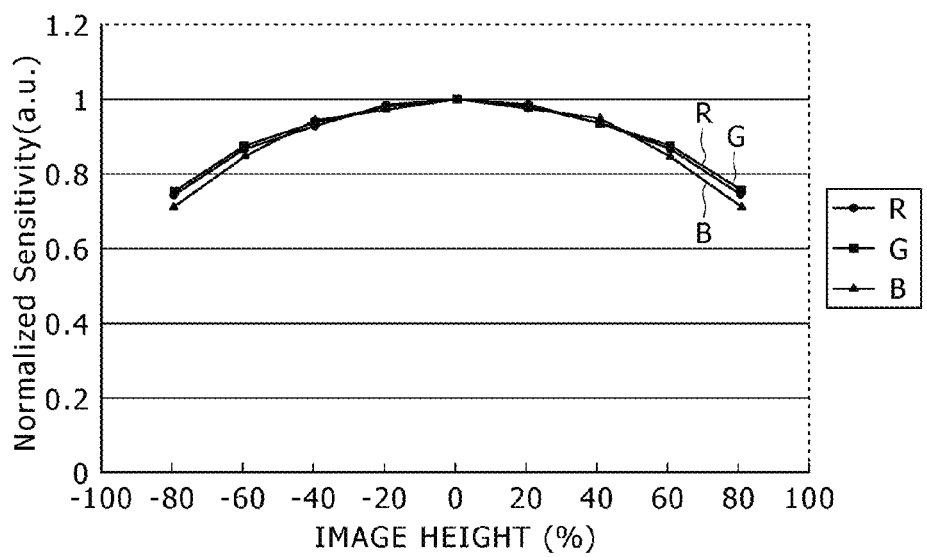

FIGS. 9A and 9B are diagrams for explaining the effect of suppression of color shading: FIG. 9A shows the case of the layout of the related art and FIG. 9B shows the case of the layout of the present embodiment. In each diagram, the sensitivity (ordinate) as a function of the image height of the microlens (abscissa) is shown about the RGB respective colors.

In the layout of the related art shown in FIG. 9A, although the sensitivities of the RGB respective colors are identical to each other around the center of the microlens (image height 0%), variation in the sensitivity exists in the range of image height±20% or more. In particular, the degree of the lowering of the sensitivity to red is higher at a part closer to the peripheral edge.

On the other hand, in the layout of the present embodiment, the sensitivities of the RGB respective colors are identical to each other in the range from the center of the microlens (image height 0%) to about ±50%. In particular, the effect of suppression of the lowering of the sensitivity to red is larger compared with the related art because the light receiving region corresponding to red is provided with a large size. Due to this feature, color shading can be suppressed in a wide range of the microlens and a correct image can be created.

Although 2×2 light receiving regions are arranged in the pixel part along the vertical and horizontal directions in the above-described respective embodiments, the present invention is not limited thereto but another arrangement configuration including e.g. 2×4 light receiving regions arranged along the vertical and horizontal directions can be applied.

Furthermore, although the aperture shape of the light receiving region is a quadrangle in all of the embodiments, employing another polygonal shape, a circle, or an ellipse suited to the energy profile is also allowed only through the change of the mask used in the formation of the element isolator.

3. Electronic Apparatus

Figure 10:
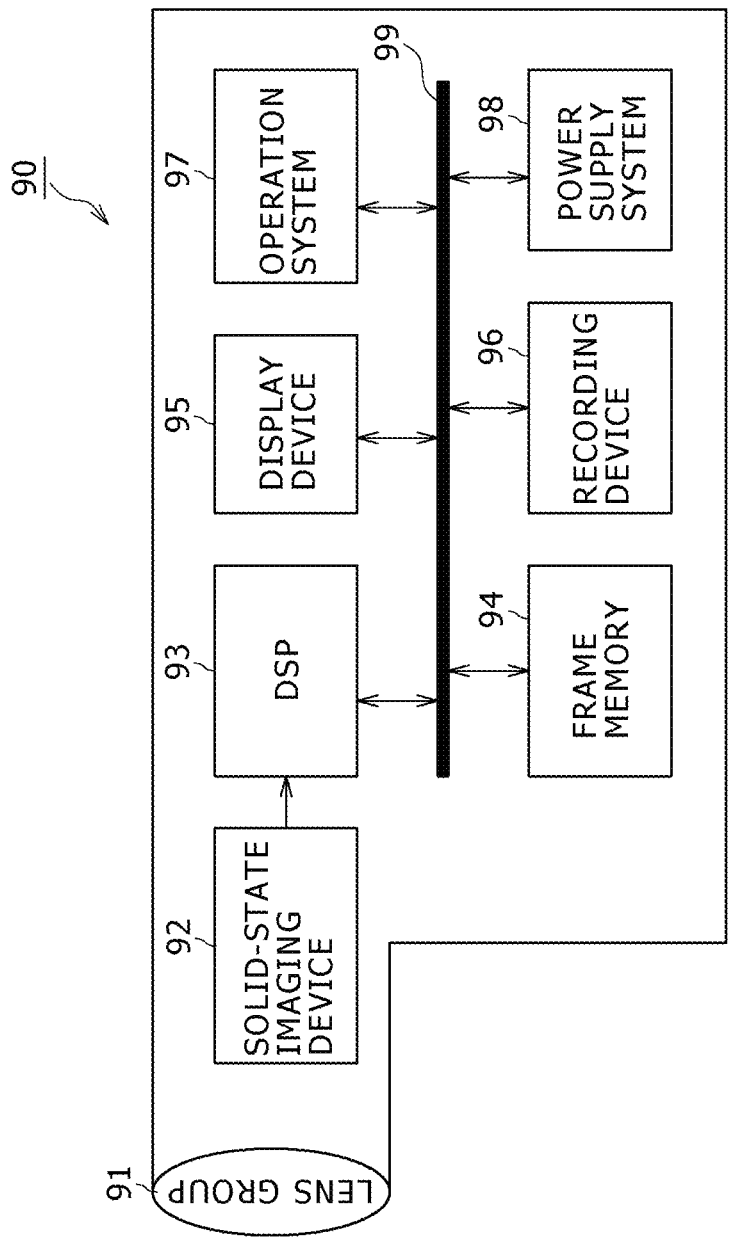
FIG. 10 is a block diagram showing a configuration example of an imaging device as one example of an electronic apparatus according to an embodiment of the present invention.
Figure 11A:
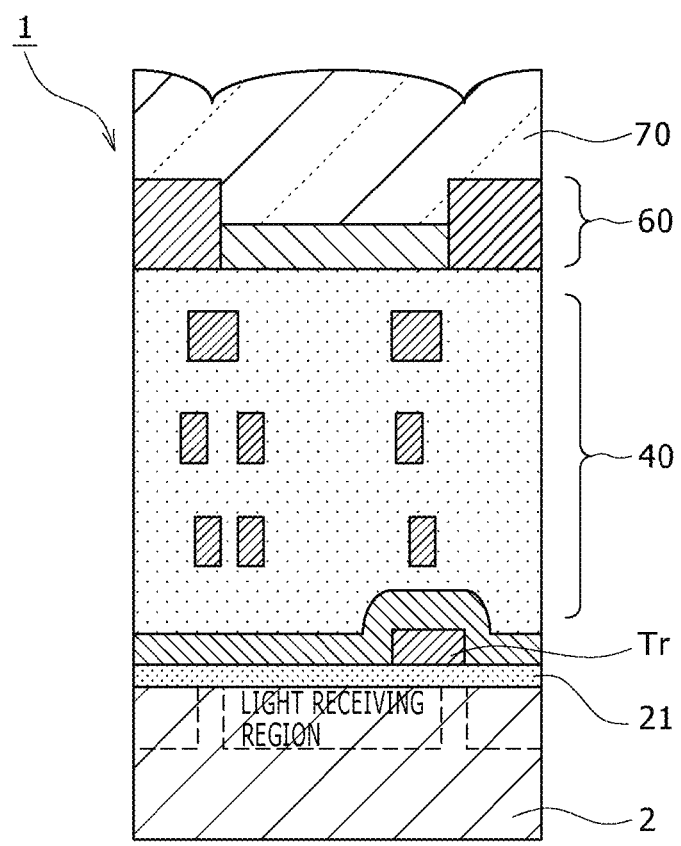
FIGS. 11A and 11B are diagrams for explaining a CMOS image sensor of a related art.
Figure 11B:
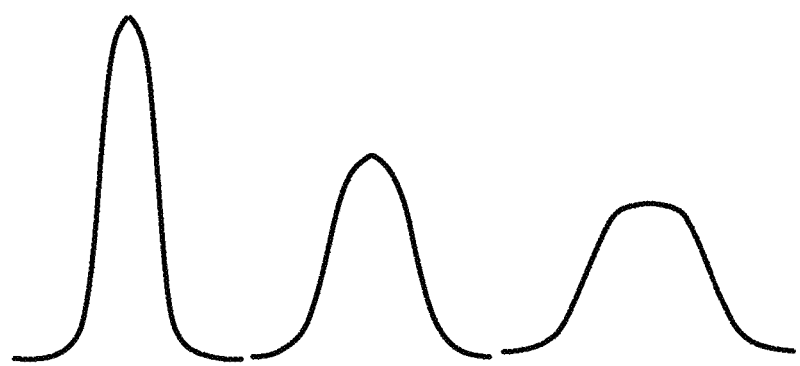

FIG. 10 is a block diagram showing a configuration example of an imaging device as one example of an electronic apparatus according to an embodiment of the present invention. As shown in FIG. 10, this imaging device 90 has an optical system including a lens group 91, a solid-state imaging device 92, a DSP circuit 93 that is a camera signal processing circuit, a frame memory 94, a display device 95, a recording device 96, an operation system 97, a power supply system 98, and so on. Of these units, the DSP circuit 93, the frame memory 94, the display device 95, the recording device 96, the operation system 97, and the power supply system 98 are connected to each other via a bus line 99.

The lens group 91 captures incident light (image light) from a subject and forms an image on the imaging plane of the solid-state imaging device 92. The solid-state imaging device 92 converts the amount of incident light by which the image is formed on the imaging plane by the lens group 91 into an electric signal on a pixel-by-pixel basis, and outputs the electric signal as a pixel signal. As this solid-state imaging device 92, the solid-state imaging device of the above-described embodiment is used.

The display device 95 is formed of a panel display device such as a liquid crystal display device or an organic electro luminescence (EL) display device, and displays a moving image or a still image obtained through the imaging by the solid-state imaging device 92. The recording device 96 records a moving image or a still image obtained through the imaging by the solid-state imaging device 92 in a recording medium such as a nonvolatile memory, a video tape, or a digital versatile disk (DVD).

The operation system 97 issues operation commands relating to various functions of this imaging device under operation by a user. The power supply system 98 timely supplies various kinds of power serving as the operating power for the DSP circuit 93, the frame memory 94, the display device 95, the recording device 96, and the operation system 97 to these supply targets.

This imaging device 90 is applied to a video camcorder, a digital still camera, and a camera module for a mobile apparatus such as a portable phone. Using the solid-state imaging device according to the above-described embodiment as this solid-state imaging device 92 can provide an imaging device that is excellent in the color balance.

The present application contains subject matter related to that disclosed in Japanese Priority Patent Application JP 2008-298952 filed in the Japan Patent Office on Nov. 25, 2008, the entire content of which is hereby incorporated by reference.

It should be understood by those skilled in the art that various modifications, combinations, sub-combinations and alterations may occur depending on design requirements and other factor in so far as they are within the scope of the appended claims or the equivalents thereof.

What is claimed is:

1. A solid-state imaging device comprising:
   a pixel part that includes a plurality of light receiving regions in a semiconductor substrate and corresponding to light of different wavelengths; and
   an element isolator in the semiconductor substrate, the element isolator configured to separate the plurality of light receiving regions from each other within the semiconductor substrate such that a size of each light receiving region in the semiconductor substrate is set according to a spread of an energy profile of light irradiation with a wavelength handled by that light receiving region.

2. The solid-state imaging device according to claim 1, wherein the element isolator separates the plurality of light receiving regions within the semiconductor substrate from each other such that, of the plurality of light receiving regions, a light receiving region corresponding to a longer wavelength light is larger than a light receiving region corresponding to a shorter wavelength light.

3. The solid-state imaging device according to claim 1, wherein:
   of 2 ×2 light receiving regions arranged along vertical and horizontal directions as the plurality of light receiving regions in the pixel part, a light receiving region corresponding to red light and a light receiving region corresponding to blue light are disposed on one diagonal line, and a light receiving region corresponding to first green light and a light receiving region corresponding to second green light are disposed on another diagonal line, and
   the element isolator is configured such that the light receiving region corresponding to the red light is larger than the light receiving region corresponding to the first green light.

4. The solid-state imaging device according to claim 3, wherein:
   the element isolator is configured such that the light receiving region corresponding to the blue light is smaller than the light receiving region corresponding to the first green light.

5. The solid-state imaging device according to claim 3, wherein:
the element isolator is configured such that the light receiving region corresponding to the red light and the light receiving region corresponding to the blue light are each shaped as a square.

6. The solid-state imaging device according to claim 3, wherein:
the element isolator is configured such that the light receiving region corresponding to the first green light and the light receiving region corresponding to the second green light are each shaped as a rectangle.

7. The solid-state imaging device according to claim 1, wherein a color filter corresponding to the different wavelengths is provided over one surface of the semiconductor substrate closer to the pixel part, and an interconnect for a signal obtained through photoelectric conversion by the plurality of light receiving regions is provided over another surface of the semiconductor substrate.

8. The solid-state imaging device according to claim 1, wherein an interconnect for a signal obtained through photoelectric conversion performed by the plurality of light receiving regions and a color filter corresponding to the different wavelengths are provided over one surface of the semiconductor substrate, the one surface being closer to the pixel part.

9. An electronic apparatus comprising:
a solid-state imaging device having (i) a pixel part that includes a plurality of light receiving regions in a semiconductor substrate and corresponding to light of different wavelengths and (ii) an element isolator in the semiconductor substrate, the element isolator configured to separate the plurality of light receiving regions from each other within the semiconductor substrate such that a size of each light receiving region in the semiconductor substrate is set according to a spread of an energy profile of light irradiation with a wavelength handled by that light receiving region; and
an image processor configured to process, as an image, a signal arising from light reception by the plurality of light receiving regions in the solid-state imaging device.

10. A solid-state imaging device comprising:
pixel means for providing a plurality of light receiving regions in a semiconductor substrate and corresponding to light of different wavelengths; and
element isolating means in the semiconductor substrate for separating the plurality of light receiving regions from each other within the semiconductor substrate such that a size of each light receiving region in the semiconductor substrate is set according to a spread of an energy profile of light irradiation with a wavelength handled by that light receiving region.

11. The solid-state imaging device according to claim 1, wherein the semiconductor substrate is a silicon substrate.

12. The electronic apparatus according to claim 9, wherein the semiconductor substrate is a silicon substrate.

13. The solid-state imaging device according to claim 10, wherein the semiconductor substrate is a silicon substrate.

* * * * *